United States Patent
Voon et al.

(10) Patent No.: US 9,520,878 B1
(45) Date of Patent: Dec. 13, 2016

(54) METHODS AND APPARATUS FOR TRANSMITTING A SIGNAL IN A SINGLE DIRECTION USING BIDIRECTIONAL DRIVER CIRCUITS

(71) Applicant: Altera Corporation, San Jose, CA (US)

(72) Inventors: Sean Woei Voon, Bukit Mertajam (MY); Aron Joseph Roth, North York (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/529,060

(22) Filed: Oct. 30, 2014

(51) Int. Cl.
| | | |
|---|---|---|
| H03K 19/173 | (2006.01) | |
| H03K 19/003 | (2006.01) | |
| H03K 19/0175 | (2006.01) | |
| H03K 19/177 | (2006.01) | |
| H03K 19/0185 | (2006.01) | |
| G06F 13/16 | (2006.01) | |

(52) U.S. Cl.
CPC ..... *H03K 19/00346* (2013.01); *G06F 13/1673* (2013.01); *H03K 19/01759* (2013.01); *H03K 19/017581* (2013.01); *H03K 19/018592* (2013.01); *H03K 19/17736* (2013.01); *H03K 19/17764* (2013.01)

(58) Field of Classification Search
CPC .............. G06F 13/1673; G06F 13/1689; G06F 13/4072; G06F 15/7867; H03K 19/018592; H03K 19/01759; H03K 19/09429; H03K 19/1737; H03K 19/17736; H03K 19/17764; G01R 31/318572; G11C 7/10

See application file for complete search history.

(56) References Cited

U.S. PATENT DOCUMENTS

| | | | |
|---|---|---|---|
| 5,248,908 A | 9/1993 | Kimura | |
| 5,517,135 A | 5/1996 | Young | |
| 5,627,480 A | 5/1997 | Young et al. | |
| 5,646,553 A * | 7/1997 | Mitchell | H03K 19/0016 326/28 |
| 5,736,870 A * | 4/1998 | Greason | H03K 19/01759 326/86 |
| 6,105,088 A * | 8/2000 | Pascale | G06F 13/409 710/100 |

(Continued)

OTHER PUBLICATIONS

Wang et al., U.S. Appl. No. 13/485,768, filed May 31, 2012.

*Primary Examiner* — Vibol Tan
(74) *Attorney, Agent, or Firm* — Mihael H. Lyons

(57) ABSTRACT

An integrated circuit may include a first logic region having a first bidirectional driver circuit and a second logic region having a logic circuit and a second bidirectional circuit. The first bidirectional driver circuit may be coupled to the second bidirectional driver circuit via a conductive path. The second bidirectional circuit may receive a dynamic control signal from the logic circuit to selectively transmit a signal to the first bidirectional driver circuit based on the dynamic control signal. The first logic region further includes an additional logic circuit. The additional logic circuit may provide an additional dynamic control signal to the first bidirectional driver circuit to selectively transmit an additional signal to the second bidirectional driver circuit over the conductive path. To prevent current contention, only one bidirectional driver circuit may be activated to drive the conductive path at a given time.

23 Claims, 4 Drawing Sheets

(56) References Cited

U.S. PATENT DOCUMENTS

| | | | | |
|---|---|---|---|---|
| 6,256,744 B1* | 7/2001 | Simonich | ............... | G06F 1/263 |
| | | | | 713/300 |
| 6,346,828 B1 | 2/2002 | Rosen et al. | | |
| 6,633,179 B1 | 10/2003 | Nakata | | |
| 7,236,010 B1* | 6/2007 | Keith | ............... | H03K 19/17728 |
| | | | | 326/41 |
| 7,622,957 B2* | 11/2009 | King | ............... | H03K 19/01858 |
| | | | | 326/30 |
| 7,800,404 B2* | 9/2010 | Verma | ............... | H03K 19/177 |
| | | | | 326/41 |
| 7,853,824 B2* | 12/2010 | Tai | ............... | G06F 11/1633 |
| | | | | 710/240 |
| 7,987,398 B2* | 7/2011 | Kitaoka | ............... | G06F 15/7867 |
| | | | | 326/39 |
| 8,203,361 B2* | 6/2012 | Uchida | ............... | G06F 13/4217 |
| | | | | 326/86 |
| 8,339,162 B2* | 12/2012 | Tsuzuki | ............... | H03K 19/0005 |
| | | | | 327/108 |
| 8,519,740 B2* | 8/2013 | Hutton | ............... | H03K 19/17764 |
| | | | | 326/38 |
| 2010/0164546 A1* | 7/2010 | Uchida | ............... | G06F 13/4217 |
| | | | | 326/86 |
| 2014/0347095 A1* | 11/2014 | Nakaya | ............... | H03K 19/01859 |
| | | | | 326/41 |

* cited by examiner

METHODS AND APPARATUS FOR TRANSMITTING A SIGNAL IN A SINGLE DIRECTION USING BIDIRECTIONAL DRIVER CIRCUITS

BACKGROUND

Generally, a programmable logic device (PLD) may include programmable logic regions that are disposed on the device in a two-dimensional array of intersecting rows and columns. Each logic region is programmed or customized to perform a variety of functions to produce output signals. Input and output signals of each logic region are routed over interconnects (e.g., conductive lines) between logic regions to route selected signals throughout the PLD.

In order to convey signals between two logic regions, a tri-stated bidirectional driver circuit can be implemented in each logic region. The tri-stated bidirectional driver circuit in each logic region passes signals via a conductive line that is shared by the two logic regions.

During power-up, the two bidirectional driver circuits are activated simultaneously and each of the bidirectional driver circuits simultaneously outputs a drive signal onto the conductive line between the logic regions. Current contention can often occur when the two bidirectional driver circuits attempt to drive the conductive line at the same time. This causes current leakage and damage to the integrated circuit. In scenarios where there is an unused logic row (e.g., a resource row of the PLD having unused logic regions), that whole row is often skipped (e.g., not programmed) during configuration of the PLD. In this case, additional configuration is required to skip the unused logic row at the configuration stage of the PLD, which can result in an undesirable increase in design cost for the PLD.

SUMMARY

In accordance with the present invention, methods and apparatuses are provided for transmitting a signal in a single direction using bidirectional driver circuits.

It is appreciated that the present invention can be implemented in numerous ways, such as a process, an apparatus, a system, or a device. Several inventive embodiments of the present invention are described below.

A logic region on an integrated circuit is disclosed. The logic region includes a bidirectional circuit and a logic circuit that is connected to the bidirectional circuit. The logic circuit may receive a control signal and an input bit and may generate a dynamic control signal that controls a signal output from the bidirectional circuit in a single direction with respect to the bidirectional circuit. The dynamic control signal has first and second logic states. The first logic state enables the bidirectional circuit whereas the second logic state disables the bidirectional circuit.

An integrated circuit is disclosed. The integrated circuit includes a first logic region having a first bidirectional driver circuit, and a second logic region having a logic circuit and a second bidirectional circuit that is connected to the first bidirectional driver circuit via a conductive path. The second bidirectional circuit may receive a dynamic control signal from the logic circuit and may selectively transmit a signal to the first bidirectional driver circuit, based on the dynamic control signal. The first logic region may include an additional logic circuit that provides an additional dynamic control signal to the first bidirectional driver circuit. The first bidirectional driver circuit may selectively transmit an additional signal to the second bidirectional driver circuit based on the additional dynamic control signal. The second bidirectional driver circuit may transmit the signal to the first bidirectional driver in a first direction over a conductive path. Accordingly, the first bidirectional driver circuit may transmit the additional signal to the second bidirectional driver circuit in a second direction that opposes the first direction over a conductive path.

A method of operating an integrated circuit having a first logic region with a first bidirectional circuit that is coupled to a second bidirectional circuit of a second logic region on the integrated circuit is disclosed. The method includes dynamically controlling the first bidirectional circuit to transmit a signal to the second logic region using a first control gate circuit coupled to the first bidirectional circuit. Accordingly, while the first bidirectional circuit transmits the signal to the second logic region, the second bidirectional circuit is dynamically controlled by a second control gate circuit coupled to the second bidirectional circuit. In this scenario, the second bidirectional circuit is disabled such that only the first bidirectional circuit transmits the signal over to the second bidirectional circuit in a single direction.

Further features of the invention, its nature and various advantages, will be more apparent from the accompanying drawings and the following detailed description of the preferred embodiments.

DETAILED DESCRIPTION

The embodiments provided herein include integrated circuits and methods for transmitting a signal in a single direction using bidirectional driver circuits.

It will be obvious, however, to one skilled in the art, that the present exemplary embodiments may be practiced without some or all of these specific details. In other instances, well-known operations have not been described in detail in order not to obscure unnecessarily the present embodiments.

Figure 1:
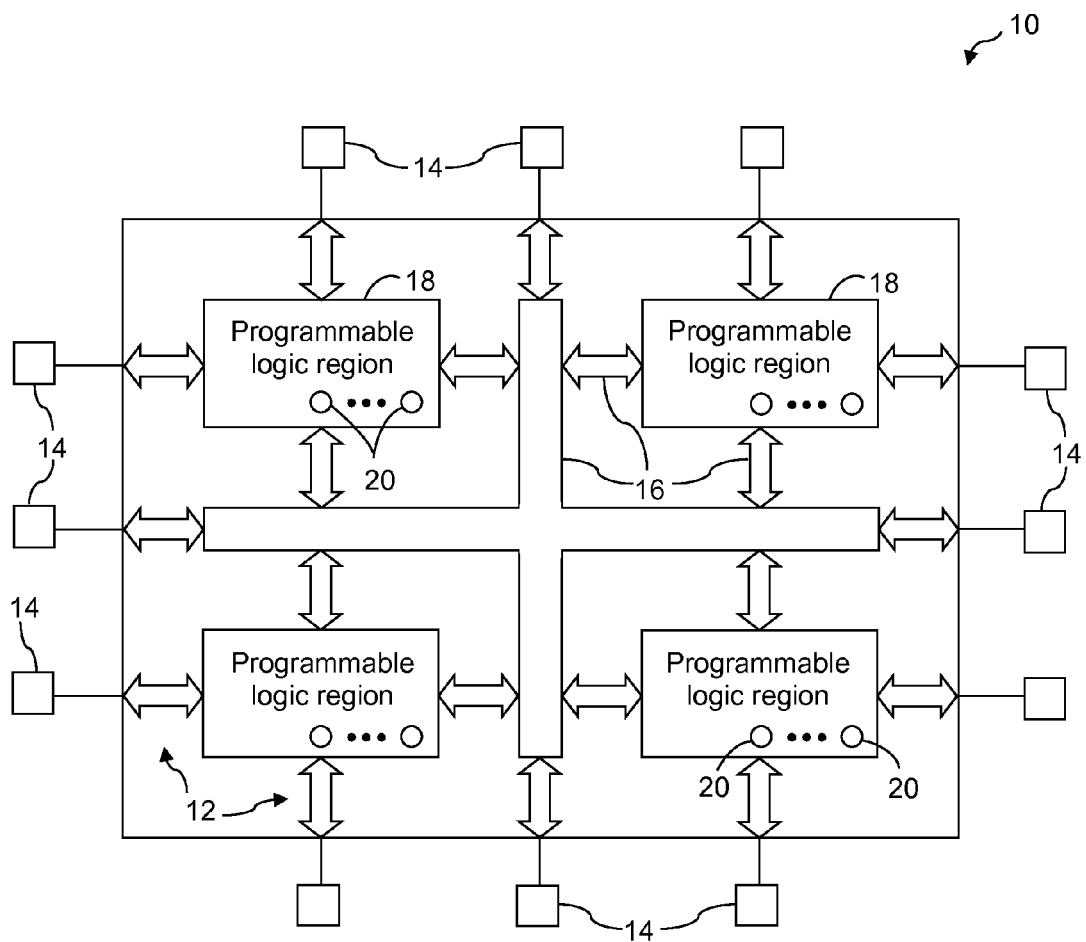
FIG. 1 is a diagram of an illustrative integrated circuit in accordance with an embodiment of the present invention.

FIG. 1 is a diagram of an illustrative integrated circuit 10 in accordance with an embodiment of the present invention. Integrated circuit 10 has input-output (IO) circuitry 12 for driving signals off of integrated circuit 10 and for receiving signals from other circuits or devices via IO pins 14. Interconnection resources 16 such as global and local vertical and horizontal conductive lines and busses may be used to route signals on integrated circuit 10. Interconnection resources 16 include fixed interconnects (conductive lines) and programmable interconnects (e.g., programmable connections between respective fixed interconnects). The programmable interconnects associated with interconnection resources 16 may be considered to be a part of programmable logic regions 18.

Memory elements 20 may be formed using complementary metal-oxide-semiconductor (CMOS) integrated circuit technology (as an example). In the context of programmable logic device, memory elements 20 may store configuration data and are therefore sometimes referred to as configuration random-access memory (CRAM) cells. In general, configuration random-access memory elements 20 may be arranged in an array pattern. In a programmable logic device, there may be millions of memory elements 20 on a single device. A user (e.g., a logic designer) may provide configuration data for the array of memory elements during programming operation. Once loaded with configuration data, memory elements 20 may selectively control (e.g., turn on and off) portions of the circuitry in programmable logic regions 18 and thereby customize its functions as desired.

The circuitry of integrated circuit 10 may be organized using any suitable architecture. For example, programmable logic regions 18 may be organized in a series of rows and columns of larger programmable logic regions each of which contains multiple smaller regions. The larger regions are sometimes referred to as logic array blocks. The smaller logic regions are sometimes referred to as logic elements. A typical logic element may contain a look-up table, registers, and programmable multiplexers. If desired, programmable logic regions 18 may be arranged in more levels or layers in which multiple large regions are interconnected to form still larger portions of logic.

Horizontal and vertical conductors and associated control circuitry may be used to access memory elements 20 when memory elements 20 are arranged in an array. The control circuitry, for example, may be used to clear all or some of the memory elements. The control circuitry may also write data to memory elements 20 and may read data from memory elements 20. Memory elements 20 may be loaded with configuration data, for instance, in CRAM arrays. The loaded configuration data may then be read out from the memory array to confirm proper data capture before integrated circuit 10 is used during normal operation in a system.

In one scenario, two of programmable logic regions 18 of integrated circuit 10 may be coupled together (e.g., in a row). A conductive line (e.g., a condcutive line of interconnection resources 16) may be used to convey signals between the programmable logic regions in that row. In order to convey signals between two programmable logic regions 18, a tri-stated bidirectional driver circuit (sometimes referred to herein as a "bidirectional driver circuit") may be implemented in each of the two programmable logic regions 18. The tri-stated bidirectional driver circuit may be configured to pass signals in either one or both directions through the conductive line.

During device power-up stage, the two bidirectional driver circuits may be activated and each of the bidirectional driver circuits may simultaneously output a drive signal to the conductive line. However, current contention may occur when the two bidirectional driver circuits attempt to drive the conductive line at the same time. Such current contention may occur because the arrival time of a drive signal from the source bidirectional driver circuit to the destination bidirectional driver circuit may be different for each bidirectional circuit. As a result, current leakage may occur, which may damage the integrated circuit.

In the case of any unused logic row (e.g., resource row having unused logic regions), the whole row can be skipped (e.g., not programmed) during configuration. However, additional configuration is required to skip the unused logic row at the configuration stage, and this may result in an undesirable increase in design cost and time.

Therefore, a flexible drive mechanism may be required to prevent current contention and to shorten the configuration time of integrated circuit 10. The flexible drive mechanism may dynamically control (i.e., enable or disable) each bidirectional driver circuit to ensure that only one bidirectional driver circuit is driving the conductive line at a given time during the power-up stage. To do so, the flexible drive mechanism may implement a corresponding logic circuit in each bidirectional driver circuit. The logic circuit may output a dynamic control signal that controls a signal output from the associated bidirectional driver circuit in a single direction with respect to the associated bidirectional driver circuit.

Figure 2:
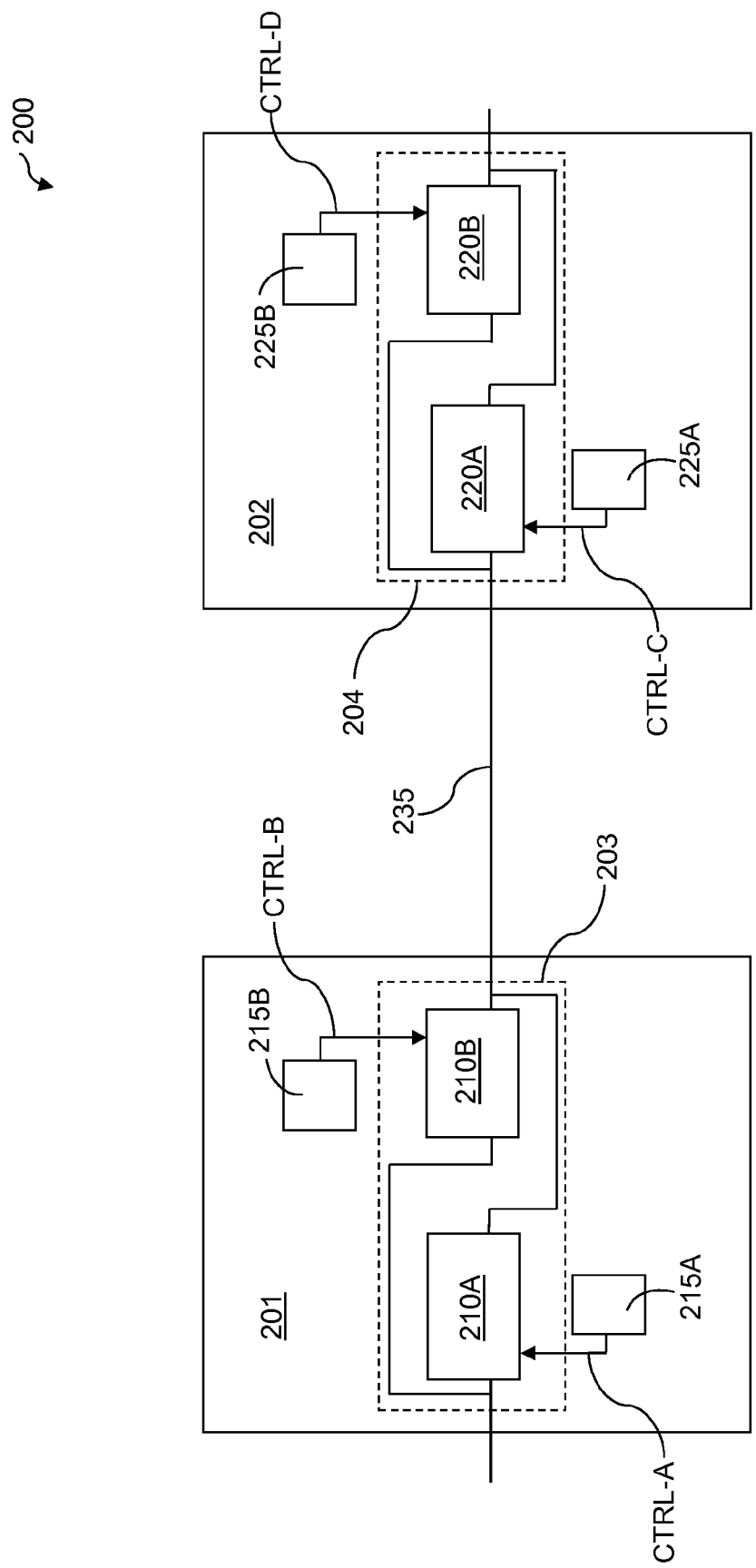
FIG. 2 shows an illustrative integrated circuit having two logic regions that are coupled together by a conductive path in accordance with an embodiment of the present invention.

FIG. 2 shows an illustrative integrated circuit 200 having two logic regions that are coupled to each other (e.g., an integrated circuit such as integrated circuit 100 of FIG. 1). As shown in FIG. 2, integrated circuit 200 includes two adjacent logic regions 201 and 202 (e.g., two logic regions such as logic regions 18 of FIG. 1) that are arranged in a row. Accordingly, integrated circuit 200 may also include a conductive line (e.g., conductive line 235) that is shared by logic regions 201 and 202 and that is used by logic regions 201 and 202 to convey signals between those logic regions.

In one embodiment, each of logic regions 201 and 202 accesses conductive line 235 through a tri-stated bidirectional driver circuit. For example, logic region 201 may contain a first bidirectional driver circuit 203 whereas logic region 202 may contain a second bidirectional driver circuit 204. Generally, a tri-stated bidirectional driver circuit may contain one or more tri-stated driver circuits, each of which can be driven to any of three logic states (e.g., a low logic state, a high logic state, and a high impedance state). As shown in FIG. 2, each of bidirectional driver circuits 203 and 204 may include two cross-coupled driver circuits (e.g., driver circuits 210A and 210B, driver circuits 220A and 220B, etc.), which may be configured to drive (pass) signals in two different (e.g., bidirectional) directions.

During power-up stage, bidirectional driver circuits 203 and 204 may be activated and may drive a signal to each other via conductive line 235. Contention may occur when both bidirectional driver circuits attempt to drive conductive line 235. To prevent contention from occurring, two control gate circuits (collectively referred to as a logic circuit) may be coupled to each bidirectional driver circuit such that bidirectional driver circuits 203 and 204 can be dynamically controlled (e.g., enabled or disabled). Such an arrangement may allow only one bidirectional driver circuit to drive conductive line 235 at any given time.

As shown in FIG. 2, each control gate circuit may output a dynamic control signal to control an associated driver circuit in each bidirectional driver circuit. For example, in bidirectional driver circuit 203, control gate (logic) circuit 215A may output control signal CTRL-A to control driver circuit 210A, whereas control gate circuit 215B may output control signal CTRL-B to control driver circuit 210B. Similarly, in bidirectional driver circuit 204, control gate circuit 225A may output control signal CTRL-C to control driver circuit 220A, whereas control gate circuit 225B may output control signal CTRL-D to control driver circuit 220B. A more detailed description of bidirectional driver circuits 203 and 204 shown in FIG. 2 will be described below with reference to FIG. 3.

Figure 3:
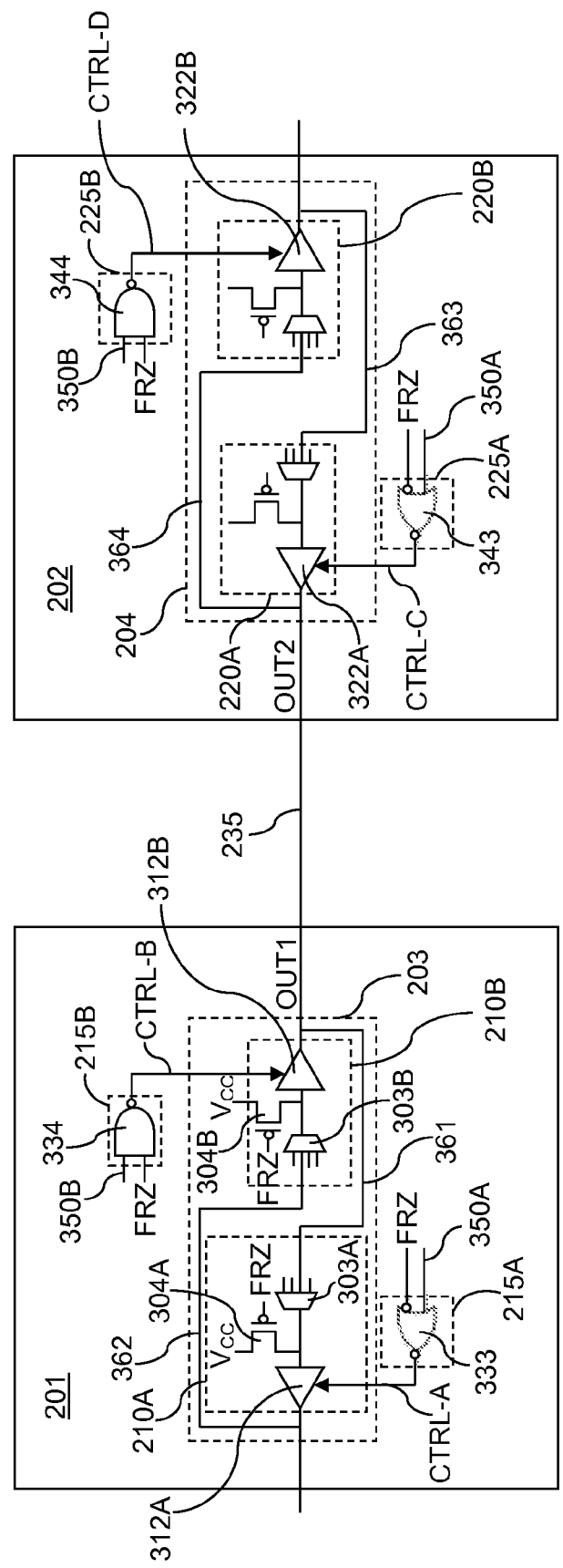
FIG. 3 shows an illustrative circuit diagram of an integrated circuit that facilitates unidirectional signal transmission between two logic regions having bidirectional line drivers in accordance with an embodiment of the present invention.

FIG. 3 shows a schematic circuit diagram of integrated circuit 200 of FIG. 2 for selectively disabling a bidirectional driver circuit (e.g., to facilitate a unidirectional signal transmission between logic regions 201 and 202 in integrated circuit 200). As mentioned above, each of logic regions 201 and 202 may include a corresponding tri-stated bidirectional driver circuit (e.g., bidirectional driver circuit 203 in region 201 and bidirectional driver circuit 204 in region 202) that is used to drive signals from one logic region to another logic region.

As mentioned above with reference to FIG. 2, bidirectional driver circuit 203 may include a pair of cross-coupled driver circuits (e.g., driver circuits 210A and 210B of FIG. 2) that drive each other in a complementary fashion in order to pass signals out of logic region 201 (e.g., onto line 235). Each of the driver circuits 210A and 210B may include corresponding multiplexer circuitry (e.g., multiplexer circuit 303A in driver circuit 210A and multiplexer circuit 303B in driver circuit 210B), which is receives one or more input signals (not shown) from within integrated circuit 200 of FIG. 2. Each of driver circuits 210A and 210B may include a driver element (e.g., driver element 312A in circuit 210A and driver element 312B in circuit 210B) that receives an output signal from the multiplexer circuit as an input drive signal. The input of driver elements 312 (and the output of multiplexers 303) may be coupled to a source-drain terminal of a corresponding PMOS transistor (PMOS transistor 304A in circuit 210A and PMOS transistor 304B in circuit 210B). Positive power supply voltage $V_{CC}$ may be provided to the PMOS transistor.

As shown in FIG. 3, the gate of the PMOS transistors 304 may be controlled using a control signal (e.g., control signal FRZ) received from a corresponding control block (not shown) to pull the input drive signal to a high logic level. This may ensure that the corresponding driver circuit 312 is driven to a logic high level for any configuration stages. It should be appreciated that the control signal FRZ may be an active-low signal, which means that control signal FRZ is set to a logic low level (e.g., logic level "0") when asserted. Control signal FRZ may sometimes be referred to herein as a freeze signal or freeze control signal. Bidirectional driver circuit 204 may operate similarly to bidirectional driver circuit 203, and therefore, the detailed description thereof is omitted for the sake of brevity.

In one embodiment, each of bidirectional driver circuits 203 and 204 may be controlled by two logic circuits (also referred to herein as control gate circuits). For example, control gate circuits 215A and 215B may control bidirectional driver circuit 203 through driver circuits 210A and 210B, respectively. Control gate circuit 215A may include logic gates such as logic gate 333 (e.g., a logic NOR gate) whereas control gate circuit 215B may include logic gates such as logic gate 334 (e.g., a logic NAND gate). Accordingly, in logic region 202, control gate circuits 225A and 225B may control bidirectional driver circuit 204 through driver circuits 220A and 220B, respectively. Control gate circuit 225A may include logic gates such as logic gate 343 (e.g., a logic NOR gate) and control gate circuit 225B may include logic gates such as logic gate 344 (e.g., a logic NAND gate). However, it should be appreciated that any appropriate logic circuits and/or combinations of logic circuits may be implemented to meet the design criteria of a particular application.

In one embodiment, control gate circuits 215A and 215B (each of which may be coupled to control the respective driver circuits 210A and 210B in bidirectional circuit 203) may be configured to receive a set of control signals (e.g., the inputs of control gate circuit 215A may receive CRAM bit 350A and control signal FRZ whereas the inputs of control gate circuit 215B may receive CRAM bit 350B and control signal FRZ), respectively. As one example, control gate circuits 215A and 215B may receive the respective CRAM bits 350A and 350B from a configuration random access memory (CRAM) cell. In another example, control gate circuits 225A and 225B (each of which may be coupled to control the respective driver circuits 220A and 220B in bidirectional circuit 204) may be configured to receive an additional set of control signals (e.g., the inputs of control gate circuit 225A may receive CRAM bit 350A and control signal FRZ whereas the inputs of gate circuit 225B may receive CRAM bit 350B and control signal FRZ), respectively. Similar to control gate circuits 215A and 215B, control gate circuits 225A and 225B may also receive CRAM bits 350A-350B from corresponding CRAM cells.

When integrated circuit 200 is powered up, the elements within bidirectional driver circuits 203 and 204 may be reset to their respective initial states. For example, the binary values of CRAM bits 350A and 350B may be reset to logic "0", respectively. Accordingly, control signal FRZ may be asserted (e.g., set to logic level "0") to control the default operational states of driver elements 312A, 312B, 322A and 322B. For example, driver elements 312B and 322B may be enabled whereas driver elements 312A and 322A may be disabled when control signal FRZ is asserted during the power-up stage.

In order to prevent current contention and leakage, bidirectional driver circuits 203 and 204 may be configured accordingly by their respective logic circuits to perform three different circuit operations. For example, the first circuit operation may allow bidirectional driver circuit 203 to transmit a signal to logic region 202 in a single direction (which will be hereinafter referred to as a first direction, e.g. in a direction to the right as shown in FIG. 3). The term "right" means that the signal transmission will flow from logic region 201 to logic region 202. The second circuit operation may allow bidirectional driver circuit 204 to transmit an additional signal to logic region 201 in the other direction (e.g. in a left direction as shown in FIG. 3) that is opposite to the first direction. The term "left" means that the signal transmission will flow from logic region 202 to logic region 201. The third circuit operation may allow any unused logic row (e.g., a logic row having unused logic regions) to be skipped from configuration, which may shorten configuration time.

In one embodiment, the first circuit operation may be performed to facilitate signal transmission in the first direction (e.g., in the right direction). For example, during the configuration stage, a user (e.g., logic designer) may configure CRAM bit 350A to a logic high level (e.g., logic level "1") and CRAM bit 350B to a logic low level (e.g., logic level "0"). When control signal FRZ is deasserted (e.g., provided at logic level "1"), the logic gates in each bidirectional driver circuit may be triggered to produce a set of dynamic control signals (e.g., control signals CTRL-A and CTRL-B in region 201 and CTRL-C and CTRL-D in region 202) to dynamically control the operational states of the associated driver circuits. Control signals CTRL-A through CTRL-D may be sometimes referred to herein as dynamic control signals because the levels of control signals CTRL-A through CTRL-D may be dynamically controlled (changed) over time without reloading configuration data into circuit 200 (e.g., as opposed to being hard coded or programmed into circuit 200 to always be asserted at a desired logic level until a new set of configuration data is loaded onto circuit 200).

For example, in bidirectional driver circuit 203, CRAM bit signal 350A is NOR-ed together with an inverted version of the deasserted FRZ signal at logic gate 333 to produce dynamic control signal CTRL-A. When dynamic control signal CTRL-A is received by driver element 312A, driver element 312A is deactivated. Additionally, CRAM bit signal 350A is NAND-ed together with control signal FRZ at logic gate 334 to produce dynamic control signal CTRL-B. When dynamic control signal CTRL-B signal is received by driver element 312B, driver element 312B is activated. Accordingly, in bidirectional driver circuit 204, CRAM bit signal 350B is NOR-ed together with the inverted version of the deasserted control signal FRZ at logic gate 343 to produce dynamic control signal CTRL-C. When dynamic control signal CTRL-C is received by driver element 322A, driver element 322A is deactivated. Additionally, CRAM bit signal 350B is NAND-ed together with control signal FRZ at logic gate 344 to produce dynamic control signal CTRL-D. When dynamic control signal CTRL-D is received by driver element 322B, driver element 322B is activated.

By deactivating driver elements 312A and 322A, the activated driver element 312B may be able to drive an output signal (e.g., signal OUT1) from logic region 201 to logic region 202 in the first direction, via a conductive path that includes conductive lines 235 and 364. For example, bidirectional driver circuit 203 may drive signal OUT1 to logic region 202 from conductive line 235 onto conductive line 364.

Based on the example above, a unidirectional signal transmission from logic region 201 to logic region 202 is established, and thereby prevents current contention from occurring at bidirectional driver circuits 203 and 204 during the power-up stage.

In another embodiment, the second circuit operation may be performed to facilitate signal transmission in the second direction (e.g., in the left direction). For example, during the configuration stage, a user (e.g., logic designer) may configure CRAM bit 350A to a logic low level (e.g., logic level "0") and CRAM bit 350B to a logic high level (e.g., logic level "1"). When control signal FRZ signal is deasserted (e.g., at logic level "1"), the logic gates in each bidirectional driver circuit may be triggered to produce a set of control signals (e.g., dynamic control signals CTRL-A and CTRL-B in region 201 and CTRL-C and CTRL-D in region 202) to dynamically control the operational states of the associated driver circuits.

For example, in bidirectional driver circuit 203, CRAM bit signal 350A is NOR-ed together with an inverted version of the deasserted control signal FRZ at logic gate 333 to produce dynamic control signal CTRL-A. When dynamic control signal CTRL-A is received by driver element 312A, driver element 312A is activated. Additionally, CRAM bit signal 350A is NAND-ed together with control signal FRZ at logic gate 334 to produce dynamic control signal CTRL-B. When dynamic control signal CTRL-B is received by driver element 312B, driver element 312B is deactivated. Accordingly, in bidirectional driver circuit 204, CRAM bit signal 350B is NOR-ed together with the inverted version of the deasserted control signal FRZ at logic gate 343 to produce dynamic control signal CTRL-C. When dynamic control signal CTRL-C is received by driver element 322A, driver element 322A is activated. Additionally, CRAM bit signal 350A is NAND-ed together with control signal FRZ at logic gate 344 to produce dynamic control signal CTRL-D. When dynamic control signal CTRL-D is received by driver element 322B, driver element 322B is deactivated.

By deactivating driver elements 312B and 322B, the activated driver element 322A may be able to drive an additional output signal (e.g., signal OUT2) from logic region 202 to logic region 201 in the second direction, via a conductive path that includes conductive lines 235 and 361. For example, bidirectional driver circuit 204 may drive signal OUT2 signal to logic region 201 from conductive line 235 onto conductive line 361.

Based on the example above, a unidirectional signal transmission from logic region 202 to logic region 201 is established, thereby preventing contention from occurring at bidirectional driver circuits 203 and 204 during the power-up stage.

In the case of unused logic regions (e.g., logic regions 201 and 202) in a particular logic row in an integrated circuit (e.g., integrated circuit 200), the third operation will be explained hereinafter. For example, when logic regions 201 and 202 are unused, CRAM bits 350A and 350B will remain at logic low levels (e.g., logic level "0") during the power-up stage. When control signal FRZ signal is deasserted (e.g., at logic level "1"), the driver circuits in both bidirectional driver circuits are enabled (e.g., activated). This means that both bidirectional driver circuits will be driving conductive line 235 at the same time. As a result, conductive line 235 is prevented from floating and thus, allowing the unused logic row to be skipped from the configuration stage. This may reduce (or shorten) the configuration time and design cost.

Figure 4:
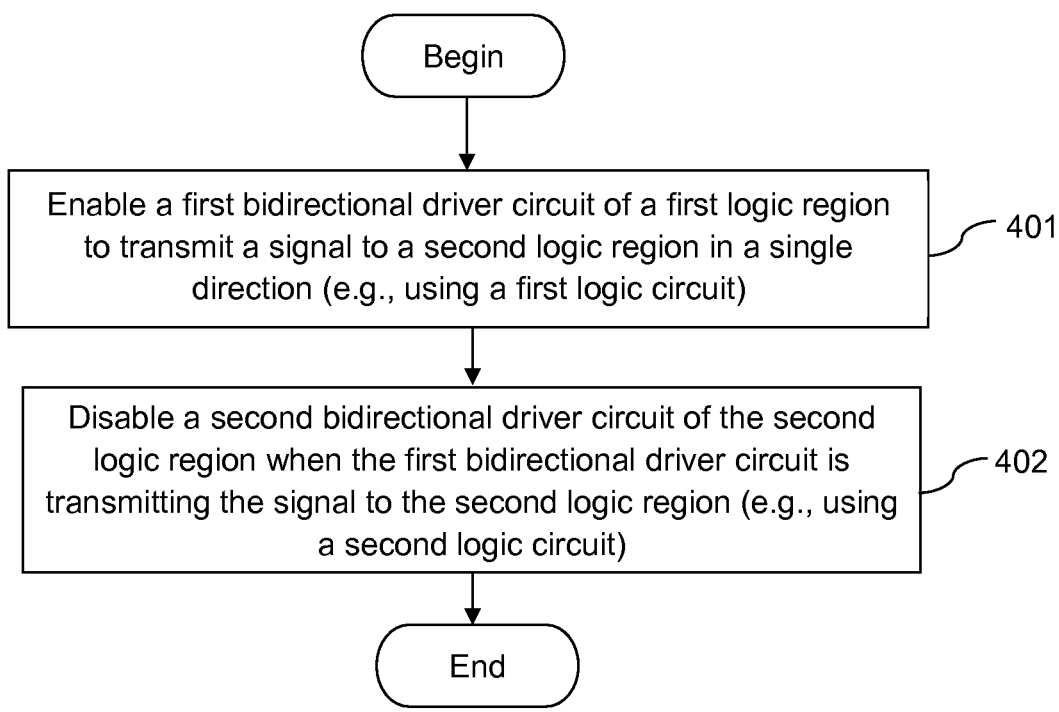
FIG. 4 is an illustrative method for operating an integrated circuit having first and second logic regions with bidirectional driver circuits that are connected to each other via a conductive path in accordance with an embodiment of the present invention.

FIG. 4 is an illustrative method for operating an integrated circuit having first and second logic regions that are connected to each other, in accordance with an embodiment of the present invention. It should be appreciated that the embodiments of FIGS. 2 and 3 may be used as examples to illustrate the steps described below. As mentioned above with reference to FIG. 2, integrated circuit 200 includes two adjacent logic regions (e.g., logic regions 201 and 202) that are arranged in a corresponding row. Accordingly, logic regions 201 and 202 may be coupled together by conductive line 235, which may be used to convey signals. Each logic region accesses conductive line 235 through a tri-stated bidirectional driver circuit. For example, logic region 201 may contain bidirectional driver circuit 203, and logic region 202 may contain bidirectional driver circuit 204.

When the integrated circuit is powered up, bidirectional driver circuit 203 of logic region 201 is enabled using control gate circuits 215A-215B to transmit a signal to logic region 202 in a single direction at step 401. In the example shown in FIG. 3, the operational state of bidirectional driver circuit 203 of logic region 201 may be controlled by control gate circuits 215A and 215B. In order to enable (e.g., activate) bidirectional driver circuit 203 to transmit a signal in the single direction i.e., a right direction (e.g., from logic region 201 to logic region 202), control gate circuits 215A and 215B may receive a set of control signals (e.g., control gate circuit 215A may receive CRAM bit signal 350A and control signal FRZ, control gate circuit 215B may receive CRAM bit signal 350B and control FRZ signal) to dynamically control the operational states of the respective driver elements 312A and 312B of bidirectional driver circuit 203. For example, in bidirectional driver circuit 203, CRAM bit signal 350A is NOR-ed together with an inverted version of the deasserted control signal FRZ at logic gate 333 to produce control signal CTRL-A. When control signal CTRL-A signal is received by driver element 312A, driver element 312A is deactivated. Additionally, CRAM bit signal 350A is NAND-ed together with the deasserted control signal FRZ at logic gate 334 to produce control signal CTRL-B signal. When control signal CTRL-B is received by driver element 312B, driver element 312B is activated.

At step 402, a second bidirectional driver circuit of the second logic region is disabled using control gate circuits 225A-225B when the first bidirectional driver circuit is transmitting the signal to the second logic region. In the example shown in FIG. 2, the operational state of bidirectional driver circuit 204 of logic region 202 may be controlled by control gate circuits 225A and 225B. In one embodiment, bidirectional driver circuit 204 may be disabled (e.g., deactivated) to allow only bidirectional circuit 203 to transmit the signal (e.g., signal OUT1 of FIG. 3) over to logic region 202 in a single direction. For example, in bidirectional driver circuit 204, CRAM bit signal 350B is NOR-ed together with the inverted version of the deasserted control signal FRZ at logic gate 343 to produce control signal CTRL-C. When control signal CTRL-C is received by driver element 322A, driver element 322A is deactivated. Additionally, CRAM bit signal 350B is NAND-ed together with deasserted control signal FRZ signal at logic gate 344 to produce CTRL-D signal. When control signal CTRL-D signal is received by driver element 322B, driver element 322B is activated. By deactivating driver elements 312A and 322A, the activated driver element 312B may be able to drive signal OUT1 from logic region 201 to logic region 202, via a conductive path that includes conductive lines 235 and 364. Such a configuration prevents contention at the first and second bidirectional driver circuits during the power-up stage.

The method and apparatus described herein may be incorporated into any suitable circuit. For example, the method and apparatus may be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components: a processor, memory, IO circuitry, and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. A logic region on an integrated circuit, comprising:
   a bidirectional circuit comprising a first driver circuit and a second driver circuit that is cross-coupled with the first driver circuit; and
   a logic circuit coupled to the bidirectional circuit that receives a control signal and an input bit, wherein the logic circuit generates a dynamic control signal based on the control signal and the input bit that controls a signal output from the bidirectional circuit in a single direction with respect to the bidirectional circuit, and wherein the logic circuit comprises:
      a first logic gate coupled to the first driver circuit that receives the control signal and the input bit; and
      a second logic gate coupled to the second driver circuit that receives the control signal and an additional input bit.

2. The logic region defined in claim 1, wherein the dynamic control signal has a first logic state and a second logic state, wherein the second logic state is different than the first logic state, wherein the first logic state enables the bidirectional circuit, and wherein the second logic state disables the bidirectional circuit.

3. The logic region defined in claim 1, wherein the first logic gate comprises a logic NAND gate that receives the control signal and the input bit.

4. The logic region defined in claim 3, wherein the second logic gate comprises a logic NOR gate that receives the additional input bit and an inverted version of the control signal.

5. The logic region defined in claim 1, wherein the second logic gate comprises a logic NOR gate that receives an inverted version of the control signal and that receives the additional input bit and wherein the additional input bit is different from the input bit received by the first logic gate.

6. The logic region defined in claim 1, wherein the bidirectional circuit comprises a tri-stated bidirectional driver circuit.

7. The logic region defined in claim 1, wherein the logic circuit receives the input bit from a configuration random access memory (CRAM) cell.

8. The logic region defined in claim 1, further comprising:
   a first transistor having a first terminal coupled to an input of the first drive circuit and having a gate terminal that receives the control signal; and
   a second transistor coupled to an input of the second drive circuit and having a gate terminal that receives the control signal.

9. An integrated circuit comprising:
   a first logic region having a first bidirectional driver circuit; and
   a second logic region having a logic circuit and a second bidirectional driver circuit that is coupled to the first bidirectional driver circuit via a conductive path, wherein the second bidirectional driver circuit comprises a driver and a transistor coupled to an input of the driver, the logic circuit receives a control signal and generates a dynamic control signal based at least on the received control signal, the driver receives the dynamic control signal from the logic circuit and selectively transmits a signal to the first bidirectional driver circuit based on the dynamic control signal, and a gate terminal of the transistor receives the control signal.

10. The integrated circuit defined in claim 9, wherein the first logic region comprises an additional logic circuit, wherein the first bidirectional driver circuit receives an additional dynamic control signal from the additional logic circuit and selectively transmits an additional signal to the second bidirectional driver circuit over the conductive path based on the additional dynamic control signal.

11. The integrated circuit defined in claim 10, wherein the second bidirectional driver circuit selectively transmits the signal to the first bidirectional driver circuit in a first direction over the conductive path, and wherein the first bidirectional driver circuit selectively transmits the additional signal to the second bidirectional driver circuit in a second direction that opposes the first direction over the conductive path.

12. The integrated circuit defined in claim 10, wherein the first bidirectional driver circuit comprises cross-coupled drivers.

13. The integrated circuit defined in claim 12, wherein the second bidirectional driver circuit comprises an additional driver that is cross-coupled with the driver.

14. The integrated circuit defined in claim 10, further comprising:
a first logic gate circuit coupled to the first bidirectional driver circuit, wherein the first logic gate circuit comprises a logic gate coupled to the first bidirectional driver circuit, wherein the first logic gate receives an input bit and a control signal and outputs the additional dynamic control signal to control the first bidirectional driver circuit.

15. The integrated circuit defined in claim 14, further comprising:
a second logic gate circuit coupled to the second bidirectional driver circuit, wherein the second logic gate circuit comprises an additional logic gate coupled to the second bidirectional driver circuit, wherein the additional logic gate receives an additional input bit and an additional control signal and outputs the dynamic control signal to control the second bidirectional driver circuit.

16. The integrated circuit defined in claim 15, wherein the logic gate disables the first bidirectional driver circuit using the additional dynamic control signal when the second bidirectional driver circuit is transmitting the signal to the first bidirectional driver circuit.

17. The integrated circuit defined in claim 15, wherein the additional logic gate disables the second bidirectional driver circuit using the dynamic control signal when the first bidirectional driver circuit is transmitting the additional signal to the second bidirectional driver circuit.

18. The integrated circuit defined in claim 9, wherein the first bidirectional driver circuit and the second bidirectional driver circuit are each tri-stated driver circuits.

19. A method of operating an integrated circuit having a first logic region with a first bidirectional circuit that is coupled to a second bidirectional circuit of a second logic region on the integrated circuit, the method comprising:
with a first control gate circuit coupled to the first bidirectional circuit, dynamically controlling the first bidirectional circuit to transmit a signal to the second logic region, wherein the first control gate circuit comprises a logic NAND gate having an output coupled to the first bidirectional circuit;
with a second control gate circuit coupled to the second bidirectional circuit, dynamically controlling the second bidirectional circuit while the first bidirectional circuit transmits the signal to the second logic region, wherein the first and second logic regions are both formed on the integrated circuit and the first and second bidirectional circuits are coupled together through a conductive path, and wherein the second control gate circuit comprises a logic NOR gate having an output coupled to the second bidirectional circuit; and
with the first and second control gate circuits, controlling the first and second bidirectional circuits so that only a single one of the first and second bidirectional circuits drives the conductive path at a given time.

20. The method defined in claim 19, wherein the logic NAND gate has an input that receives a control signal and the logic NOR gate has an input that receives the control signal.

21. The method defined in claim 20, wherein the logic NAND gate has an additional input that receives a first input bit and the logic NOR gate has an additional input that receives a second input bit that is different from the first input bit.

22. The method defined in claim 21, the method further comprising:
with the logic NAND gate, generating a first driver control signal by performing a logic NAND operation on the control signal and the first input bit;
with the logic NAND gate, dynamically controlling the first bidirectional circuit to transmit the signal to the second logic region by providing the first driver control signal to the first bidirectional circuit;
with the logic NOR gate, generating a second driver control signal by performing a logic NOR operation on the control signal and the second input bit; and
with the logic NOR gate, dynamically controlling the second bidirectional circuit by providing the second driver control signal to the second bidirectional circuit.

23. The method defined in claim 19, wherein the first bidirectional circuit comprises a first driver circuit and a second driver circuit that is cross-coupled with the first driver circuit, wherein the first bidirectional circuit further comprises a first multiplexer interposed between an output of the first driver circuit and an input of the second driver circuit, and wherein the first bidirectional circuit further comprises a second multiplexer interposed between an output of the second driver circuit and an input of the first driver circuit.

* * * * *